United States Patent [19]

Lemon

[11] Patent Number: 5,192,912
[45] Date of Patent: Mar. 9, 1993

[54] APPARATUS FOR DETERMINING WIRING ORIENTATION AT ELECTRICAL CONNECTORS INCLUDING PLURAL LIGHT INDICATORS AND ROTARY SWITCH

[76] Inventor: Neldon L. Lemon, 3200 Terrace Dr., Moab, Utah 84532

[21] Appl. No.: 743,677

[22] Filed: Aug. 12, 1991

[51] Int. Cl.[5] .................................................. G01R 31/02
[52] U.S. Cl. ................................... 324/504; 324/503; 324/542
[58] Field of Search ................. 324/66, 503, 504, 540, 324/542

[56] References Cited

U.S. PATENT DOCUMENTS

| | | | |
|---|---|---|---|
| 3,103,808 | 9/1963 | Eichelberger | 324/504 |
| 3,428,888 | 2/1969 | Nolte | 324/504 |
| 3,663,939 | 5/1972 | Olsson | 324/504 |
| 4,166,242 | 8/1979 | Spiteri | 324/504 |
| 4,547,722 | 10/1985 | Sarlo | 324/504 |
| 4,884,032 | 11/1989 | La Pensee | 324/504 |

Primary Examiner—Gerard R. Strecker
Assistant Examiner—Diep Do

[57] ABSTRACT

A portable apparatus for checking the wiring orientation at electrical connectors of trailers or trailer towing vehicles is described. The housing of the apparatus supports a rotary switch and a plurality of multi-terminal connector plugs and/or receptacle portions. The rotary switch has a plurality of switch positions with indicia at each switch position indicative of a particular electrical function such as a particular lighting system in the trailer or trailer towing vehicle. Each switch position of the rotary switch is connected to each terminal positioned on each connector portion at a location that is industrially standardized to electrically couple an electrical system in the trailer towing vehicle to a corresponding electrical system in the trailer. By moving the rotary switch from position to position the orientation of the wiring at the connector on the trailer or trailer towing vehicle is checked by sequentially activating the electrical systems in the trailer or trailer towing vehicle.

8 Claims, 1 Drawing Sheet

APPARATUS FOR DETERMINING WIRING ORIENTATION AT ELECTRICAL CONNECTORS INCLUDING PLURAL LIGHT INDICATORS AND ROTARY SWITCH

BACKGROUND OF THE INVENTION

The present invention relates generally to a device or apparatus for determining the alignment or orientation of electrical wiring at connectors used for coupling electrical circuits, and more particularly to such a device for checking the orientation of the wiring used for electrical systems such as lighting circuits at terminals of connectors utilized for coupling electrical systems of trailers to corresponding electrical systems in trailer towing vehicles.

In transportation and recreational fields, it is common place to utilize trailers towed by various forms of vehicles, such as tractors, recreational vehicles, small trucks, and automobiles. A large variety of trailers are utilized in these fields ranging from relatively large units such as those used in tractor trailer combinations, down through mobile homes to relatively small units such as utility or boat trailers. Highway safety regulations require that the trailer be at least equipped with lighting systems for night travel and with most trailers being required to include lights as used for indicating vehicle turning and stopping.

The various lights in the lighting systems used on trailers are intended to function concurrently with the corresponding lights on the trailer towing vehicle. To accomplish this goal, a suitable electrical connector is usually positioned between the trailer and the trailer towing vehicle for coupling the wiring of the lighting circuits in the trailer towing vehicle to the wiring for corresponding lighting circuits in the trailer. The electrical connectors utilized for such purposes are usually of the disconnectable plug-receptacle type wherein a plurality of wires leading from particular lights in the trailer towing vehicle are usually coupled to individual pin terminals in the plug portion of the connector while wires leading to corresponding lights in the trailer are coupled to individual socket terminals in the receptacle portion of the connector. In order to assure that the proper lighting sequence occurs, each wire leading from a particular light in the trailer towing vehicle that is connected to a pin in the connector must match with a wire leading to a corresponding light in the trailer and connected to a socket engaging the particular pin. Normally, the connectors used between trailers and trailer towing vehicles are provided with a standardized, factory recommended, wire connecting pattern at each pin and socket in the connector to achieve standarization in connector applications and thereby minimize wire orientation problems in trailer lighting applications.

However, it has been found that the lighting systems in many trailers as well as those in trailer towing vehicles are often miswired at the connectors even though the wiring for the lighting systems is most frequently color-coded according to accepted standards and the terminals at the connector are appropriately marked and/or located in certain standardized positions on the connector body. Such miswiring presents considerable difficulties in providing the proper lighting activation on the trailer as well as presenting problems associated with any correcting of the wiring at the connector. These wiring problems at the electrical connector frequently occur in a trailer leasing and rental applications and in the heavy truck industry where tractors are often mated with different trailers. In many instances, the connector portion attached to the trailer towing vehicle is different from that of the trailer so as to necessitate the changing of at least one of the connector portions to provide connector conformance. Such installation of new connectors or connector portions on trailer towing vehicles and/or trailers also presents problems in achieving the correct wiring orientation at the connector. In addition to trailer lighting, the connectors are often used to couple the DC charging circuit of the trailer towing vehicle to storage batteries used in the trailers or for the coupling of hot electrical leads from the trailer towing vehicle to an electrical mechanism carried by the trailer.

Previous efforts in determining the correct wiring at the connector and the correcting of the wiring at such connectors have been somewhat inefficient and cumbersome. Normally, a hit or miss type approach is used wherein the trailer towing vehicle is attached to the trailer and a particular light system on the towing vehicle is activated so that the wiring to the matching lighting system on the trailer can be checked. If the wiring is correct at one point through the connector then another lighting system on the towing vehicle is activated to check the corresponding lighting system on the trailer. When an incorrect lighting sequence occurs, the wires at the connector are moved from terminal to terminal, usually on the trailer portion of the connector, until the correct wiring position for the desired light operation is achieved. This process is repeated until all the wiring circuits for the light systems on the trailer are correctly aligned at the connector. The correctness of the wiring orientation for the charging circuit hookup is also more difficult to ascertain since it requires the operation of the engine on the trailer towing vehicle to energize the charging circuit. This haphazard moving of the wires from terminal to terminal to provide the desired lighting and charging circuit operation often leads to the miswiring of the connector when the trailer is to be coupled to a different trailer towing vehicle.

SUMMARY OF THE INVENTION

Accordingly, it is a primary or principal aim or objective of the present invention to provide a device or apparatus for checking the orientation of the electrical wiring at the connector portion on the trailer or the trailer towing vehicle to provide a reading for each lighting circuit and any other circuit such as the charging circuit at the connector to assure that the individual wires are coupled to the connector portion carried by the trailer towing vehicle at the proper terminals thereon to assure correct lighting or electrical circuit activation in the trailer.

Another object of the present invention is to provide a lighting and electrical circuit testing apparatus that is used for individually checking orientation of the wiring connected to the terminals of a plug or receptacle portion of connectors of different types.

A further object is to provide a readily portable light circuit testing apparatus for checking the wiring connections of various connectors utilized between a trailer towing vehicle and the trailer.

A still further object of the present invention is to provide a portable device used for checking the orientation of wiring at terminal connections on a electrical connector portion such as the plug or receptacle half of the connector attached to the trailer towing vehicle or the trailer for facilitating any needed corrections in such a wiring arrangement without requiring that the trailer towing vehicle be coupled to the trailer.

Generally, the apparatus of the present invention is used for determining the orientation of each of a plurality of electrical leads coupled at a plurality of terminals on a plug or receptacle portion of an electrical connector. The apparatus comprises: a first connector means having a plurality of terminals adapted to receive mating connector means having a plurality of terminals thereon with each terminal coupled through each of a plurality of electrical leads to each of a plurality of electricity operatable means having separate selected functions; switch means having a plurality of switch positions with each position being indicative of a particular function to be provided by one of the selected electrically operatable means; lead means connected to the switch means at each of the terminals and to the first connector means at each terminal thereof disposed at a location thereon preselected to be coupled through a terminal on the mating connector means and one of the plurality of electrical leads to a selected one of the plurality of electrically operatable means; and power supply means connected to the switch means for providing an electrical current through the switch means at any one of the switch positions and through one of the electrical leads to one of the terminals on the mating connector means for determining if the electrical lead coupled to that one particular terminal is coupled to the terminal of the mating connector means that is at a location thereon for providing the selected function indicated by the selected switch position.

When the apparatus of the present invention is used to the orientation of the electrically leads at the connector on a trailer, the power supply means is connected by further lead means to the switch means to energize the electrical operatable means coupled through one of the plurality of electrical leads to one of the terminals on the mating connector means. Alternatively, when the apparatus of the present invention is used to check the orientation of the electrical leads at the connector on a trailer towing vehicle, the power supply means is connected to each of the switch positions on the switch means the each of the terminals of the mating connector means and each of the plurality of electrical leads Other and further objects of the present invention will become obvious upon an understanding of the illustrative embodiment about to be described or will be indicated in the appended claims, and various advantages not referred to herein will occur to one skilled in the art upon employment of the invention in practice.

Preferred embodiments of the invention have been chosen for the purpose of illustration and description. The preferred embodiments illustrated are not intended to be exhaustive nor to limit the invention to the precise forms shown. The preferred embodiments are chosen and described in order to best explain the principles of the invention and their application and practical use to thereby enable others skilled in the art to best utilize the invention in various embodiments and modifications as are best adapted to the particular use contemplated.

DETAILED DESCRIPTION OF THE INVENTION

As generally described above, the present invention is directed to a portable apparatus for checking each terminal of multiple terminal electrical connectors employed between trailers and trailer towing vehicles to determine if the wiring connected to any particular terminal will provide the expected function in the trailer electrical system when that function is activated in the trailer towing vehicle. If the trailer electrical system responds in a manner different from that directed by the apparatus of the present invention, then the wiring of at least two of the terminals of the connector is incorrect according to the wiring standard designated for the particular connector. The wires at the terminals can then be switched about and easily checked for proper orientation with the apparatus of the present invention until the wiring at each connector terminal leads to the particular circuit expected to be actuated by the corresponding electrical system in the trailer towing vehicle.

Figure 1:
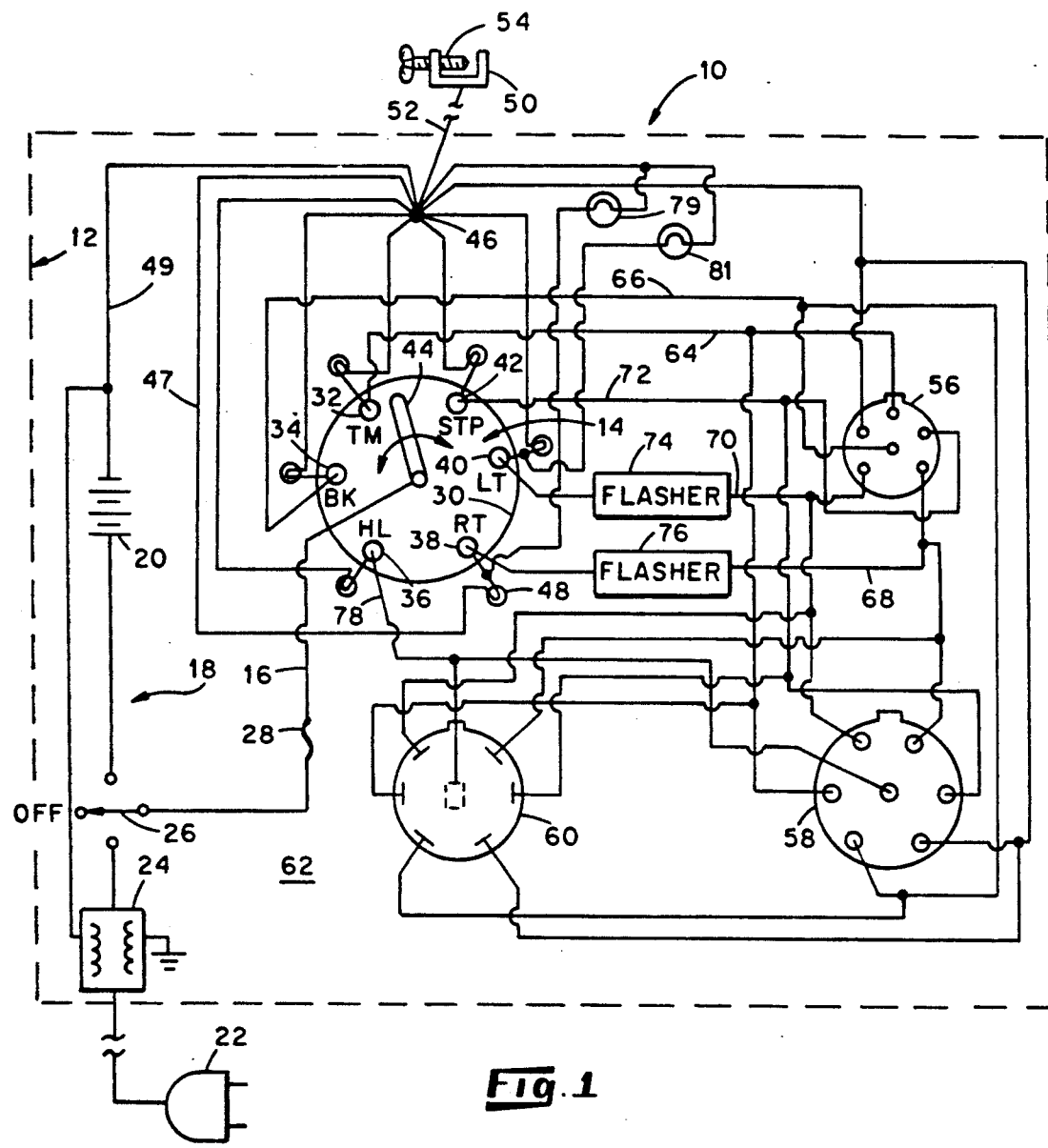
FIG. 1 is a schematic view of the apparatus of the present invention illustrating the wiring circuits utilized for determining the correct electrical connections at particular terminals on a plurality of different types of electrical connectors provided between trailers and trailer towing vehicles and used for providing selected electrical functions in the trailer.

With reference to FIG. 1, the connector checking apparatus 10 of the present invention is primarily contained in and supported by a portable cabinet or housing, preferably constructed of a non-conducting material such as a suitable plastic, as generally indicated by the dotted line 12. The electrical circuit of the apparatus 10 includes a rotary switch 14 coupled by wire or lead 16 to a power supply 18 which is capable of providing the same level of dc voltage as utilized in the lighting and electrical systems in the trailer and trailer towing vehicle. Normally, a 12 volt dc power supply is required for such lighting and electrical systems and can be provided by using a suitable 12 volt dc storage battery 20. The use of such a storage battery enhances the portability and field use of the subject apparatus. Alternatively, a 12 volt dc power supply can be provided by connecting plug 22 into a 110 volt ac outlet (not shown) in a shop or the like. When using the 110 volt supply, a suitable dc power supply such as an ac converter 24 is utilized for converting the ac voltage to 12 volt dc for use in the connector checking apparatus 10. The battery 20 and the ac power supply through the converter 24 are each connected to ground potential at an appropriate location on the housing 12, as will be described below. A suitable three position switch 26 provided with the common terminal connected to battery 20, the ac power supply, or to turn the circuit off by removing power from lead 16. Also, an in-line fuse or circuit breaker 28 is preferably placed in lead 16 between the power supply 18 and the rotary switch 14 to provide for interrupting power supply in the event of a short or other circuit malfunction such as in the trailer or trailer towing vehicle.

The rotary switch 14 may be of any suitable commercially available type that has at least six switch positions which can be individually and positively engaged by a rotatable switch lever or arm and which can be marked at each switch position with a suitable marking indicative of the selected switch position. As shown, the rotary switch 14 comprises a round switch housing 30 having six circumferentially spaced switched positions which are individually marked at each position or station with suitable indicia such as follows: marked at switch position 32 with "TM" for tail markers and side marker lights; marked at position 34 with "BK" for brake lights; marked at switch position 36 with "HL" for a hot line to a trailer electrical system such as a charging line utilized for charging dc batteries in a trailer; marked at switch position 38 with "RT" for right turn signal lights; marked at switch position 40 with "LT" for left turn signal lights; and marked at switch position 42 with "STP" for stop lights. The stop light position 42 is a separate switch position primarily for use with trailer towing vehicles and possibly some trailers wherein a double electrical circuit is utilized for the stop and turn signal lights. For example, in many vehicles manufactured in foreign countries the turn signal wiring circuit for the amber-colored turn signal lights is separate from the wiring circuit used for the red-colored stop lights. Each switch position is individually provided with a contact which is contactable by a rotatable switch lever arm 44 for coupling the contacted switch terminal to a selected power source through lead 16 and switch 26.

As illustrated in FIG. 1, each switch position of the rotary switch 14 is preferably provided with a light such as a small pixie-type light, an LED or any other indicator or electrically actuated means which will indicate the selected switch position and confirm current flow through the selected switch position. The individual lights on the rotary switch 14 are each in a circuit coupled in series with the power supply 18 and a common ground terminal 46. For example, at the right turn signal or the "RT" switch position 38, a light 48 is coupled in series with the switch terminal and the grounding terminal 46 through a lead 47. Each of the other switch positions is provided with a similar light and wiring arrangement.

The battery 20 and the ac power supply 24 are each connected to the ground terminal 46 by lead 49. This ground terminal 46 in housing 12 is, in turn, electrically coupled to the trailer or the trailer towing vehicle, depending upon which one is being checked at the connector by the connector checking apparatus 10, in order to establish a circuit from the connector checking apparatus 10 through the electrical system being checked in the trailer or the trailer towing vehicle. A suitable grounding connection can be provided by utilizing a small C-clamp 50 connected to the ground terminal 46 by lead 52 and having a pointed end at the end of the screw 54 in the clamp for assuring penetration of the grounding screw 54 to metal through painted or rusted surfaces on the trailer or trailer towing vehicle.

As shown in FIG. 1, the housing 12 is provided with three different types of connector receptacles at 56, 58, and 60 with each receptacle being exposed and being adapted to receive a connector plug of a similar connector type that is electrically coupled to the electrical circuitry to be checked in the trailer or trailer towing vehicle. While only three connector receptacles are illustrated, it will appear clear that any desired number of different types of connector receptacles and/or connector plugs may be supported by the housing 12. Preferably, the housing 12 is provided with a surface panel 62 upon which the switches 14 and 26, the circuit breaker 28, and the connector receptacles 56, 58 and 60 are mounted for easy access by the user.

The terminals at the sockets in each of the illustrated connector receptacles 56, 58, and 60 that have common wiring circuit applications are electrically coupled to a terminal at the rotary switch 14 that provides the standard function for the electrical system coupled to the particular terminal of the connector receptacles 56, 58, and 60. As shown the common terminals in connector receptacles 56, 58, and 60 are connected in series with appropriate terminals in the rotary switch 14. However, it will appear clear that the terminals in these and other connector socket and/or connector plugs as commonly used in the transportation and recreational fields may be coupled in parallel to the appropriate terminal positions of the rotary switch 14. As illustrated in FIG. 1, the terminal having the "TM" markings at position 32 is serially connected by lead 64 to a terminal in each of the connector sockets and connectors receptacles 56, 58, and 60 that has a standard or accepted designation as the terminal to which the wiring circuit for the tail markers and side marker lights is to be connected. Each of the other terminal positions at the rotary switch as designated by numerals 34, 38, 40, and 42 are respectively coupled to appropriate terminals in the connectors 56, 58, and 60 by leads 64, 68, 70, and 72. The leads 68 and 70 from the right and left turn terminal positions on the rotary switch 14 are each provided with a conventional turn signal flasher as generally shown at 74 and 76, respectively. The hot line, "HL" terminal 36 in the rotary switch is shown coupled to the terminal at the center socket in the connector receptacles 58 and 60 by lead 78. These connector receptacles 58 and 60, illustrated, are of the type used in applications wherein the charging circuit of the trailer towing vehicle is usually connected to storage batteries in the trailer. The connector receptacle 56, on the other hand, is of a type wherein such a hot line connection is not utilized.

When checking the wiring orientation at the connector of the trailer towing vehicle, the power supply utilized on the trailer towing vehicle is used to energize the lights at each switch position of the rotary switch through appropriate activation of the electrical circuits on the trailer towing vehicle. For such checking, the flashers 74 and 76 are provided with lights 79 and 81 which are individually energized and flash when the appropriate turn signal is activated in the trailer towing vehicle. These lights 79 and 81 are each of a sufficient wattage so as to impose an adequate load on each flasher 74 or 76 to effect the activation thereof. These lights 79 and 81 are turned on but do not flash when the apparatus 10 is using the power supply 18 for checking the wiring orientation for the turn signals at the connector of a trailer.

Figure 2:
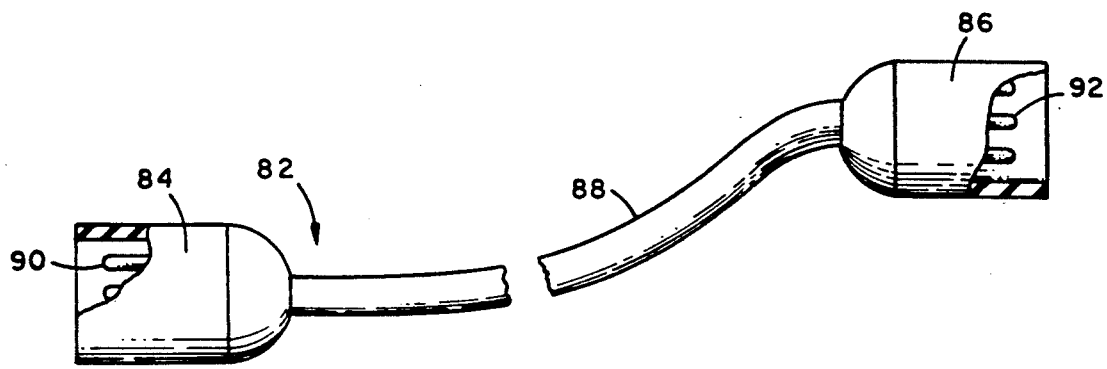
FIG. 2 is a sectional view illustrating a pigtail with a back-two-back plug arrangement which is utilized to check the wiring at the receptacle portion of a connector coupled to the wiring in the trailer or trailer towing vehicle when the receptacle portion of the selected connector is connected into the wiring circuit of the connector testing apparatus of the present invention.

With the apparatus containing connector receptacles as shown in FIG. 1, and it is desired to check the wiring orientation of the wiring at a connector receptacle, a "pigtail" plug adaptor 82 as illustrated in FIG. 2 can be plugged into a connector receptacle carried by the apparatus 10 to allow the circuit-wired connector receptacle to be plugged into the apparatus 10 for the desired wiring check. As shown, the connector plug adaptor 82 is provided by using back-to-back plug type connectors 84 and 86 coupled together by a multiple-conductor cable 88 at an appropriate length of about 1 to 3 feet, or longer if desired for connecting pins 90 and 92 in plug connector portions 84 and 86 together at appropriate locations. When the adaptor 82 is plugged into a receptacle connector of the corresponding type, the receptacle connector carried by the trailer or the trailer towing vehicle may be plugged into the adaptor 82 so that the wiring to the connector receptacle may be checked by the apparatus of the present invention. While the adaptor 82 shown in FIG. 2 is of the plug type, it will appear clear that if the apparatus 10 supports a plug portion of the connector, that an adaptor 82 formed of a pigtail with back-to-back connector receptacles could be used to check the wiring to the plug portion of a connector that is electrically wired into the circuitry of a trailer or trailer towing vehicle.

In a typical operation of the present invention, the orientation of the wiring circuits at the connector of a trailer that is to be electrically coupled to the corresponding wiring circuits in the trailer towing vehicle may be checked and corrected by employing the apparatus 10 and procedural steps such as set forth below. If the trailer electical system to be check by the apparatus 10 of the present invention is in a shop or in an area relativley close to a 110 volt ac outlet, then the apparataus 10 can be operated by using the ac power source through plug 22. On the other hand, if the trailer to be checked is in the field or in a location relatively remote to a 110 volt ac power outlet, then the portability of the apparatus 10 is utilized with the storage battery 20 providing the power for the operation of the apparatus 10 by appropriate selection through selector switch 26. In operation, the apparatus 10 is grounded to the trailer by using the C-clamp 50. The plug or receptacle portion of the trailer connector is then plugged into an appropriate mating connector plug or receptacle supported on the panel 62 of the apparatus 10. The switch 26 is then positioned to select the battery power 20 or the power provided from a 110 volt ac outlet source through plug 22. The arm 44 of the rotary switch 14 is then sequentially moved through the indicated positions to select and activate certain electrical systems or lighting circuits in the trailer. If the correct electrical systems or circuits are actuated by moving the switch arm 44 from position to position then the wiring for the trailer lighting system and other electrical circuits is properly oriented at the connector according to the factory standard for the particular connector type being utilized on the trailer. On the other hand, if the lighting system or electrical circuit activated in the trailer is different from that indicated by the position of the switch arm 44, then the wiring at the connector must be interchanged until the switch positions on the apparatus 10 and the trailer electrical systems and lighting circuits correspond. The wiring at the connector of the trailer towing vehicle may be similarly checked by the apparatus 10 to make sure that wiring thereto is standardized.

If the orientation of the wiring circuits at the connector of the trailer towing vehicle it to be checked, an appropriate connector portion on the apparatus 10 is connected to the connector portion on the trailer towing vehicle, usually by the adaptor 82. The switch 26 is placed in the off-position and the apparatus is grounded to the trailer towing vehicle by using the C-clamp 50. The electrical circuits in the trailer towing vehicle that are coupled to the connector portion carried thereby are then sequentially actuated by using the power supply on board the trailer towing vehicle. If the wiring orientation at the connector on the trailer towing vehicle is correct then the activation of any particular lighting system or the hot lead on the trailer towing vehicle will activate a corresponding light at the rotary switch 14. The lights 79 and 81 at the flashers should be sufficiently exposed so that they may be visually observed for facilitating the checking of the turn signal wiring at the connector on the trailer towing vehicle.

It will be seen that the present invention provides a readily portable apparatus for checking the wiring at electrical connectors as well as facilitating the fixing or lighting circuits and electrical systems of trailers in a manner considerably easier and quicker than heretofore possible. The present invention provides for the checking of the wire orientation at the connector and also electrically activates any of several selected circuits so that adjustments and/or replacements thereto can be readily made. The apparatus of the present invention is particularly useful for the replacement of electrical connectors on trailers and trailer towing vehicles in that by simply connecting the connector portion to be placed on the trailer or trailer towing vehicle to the appropriate connector portion in the apparatus 10, the correct wiring at the proper terminals for the lighting circuits and charging circuits may be readily achieved on the connector portion being replaced. Also, be being able to check the lighting systems and other electrical circuits in the trailer without coupling the trailer towing vehicle to the trailer, the use of the apparatus of the present invention greatly facilitates the checking of the wiring orientation and any required reorientation thereof at the connector portion carried by the trailer.

What is claimed is:

1. An apparatus for determining the orientation of each of a plurality of electrical leads coupled at a plurality of terminals on a plug or receptacle portion of an electrical connector comprising:

housing means;

a plurality of connector means of different configurations supported by said housing means with each of said plurality of connector means having a plurality of terminals and adapted to receive a correspondingly configured mating connector means having a plurality of terminals thereon with selected ones of said plurality of terminals on said mating connector means each being coupled through each of a pluarlity of electrical leads to each of a plurality of electrically operatable means having separate selected functions:

rotary switch means supported by said housing and having a plurality of switch contacts corresponding to different switch positions and a rotary arm for selective connection to said switch contacts with each switch position being indicative of a particular function to be provided by one of said electrically operatable means;

first lead means connected to said rotary switch means contacts at each of the switch positions and to each of said plurality of connector means at each terminal thereof disposed at a location thereon preselected to be coupled through a terminal on the mating connector means receivable by one of said plurality of connector means and one of said plurality of electrical leads to a selected one of said plurality of electrically operatable means;

lighting means connected to said rotary switch means contacts at each of said switch positions and to each of said plurality of terminals on said connector means; and power supply means connectable to the rotary arm of said rotary switch means for providing an electrical current to any of said lighting means at any of said switch positions and any one of said plurality of electrial leads to one of said terminals on the mating connector means when coupled to a correspondingly configured one of said plurality of connector means for determining if the electrical lead coupled to a particular one of said terrminals on the mating connector means is coupled to the terminal of the mating connector means that is at a location thereon for providing the selected function as indicated by the lighting of a particular one of the lighting means.

2. An apparatus as claimed in claim 1, wherein said power supply means is connected by second lead means to said rotary arm of said rotary switch means to energize the lighting means in the switch position and the electrical operatable means coupled through one of said plurality of electrical leads to one of said terminals on the mating connector means when coupled to a corresponding one of said plurality of connector means.

3. An apparatus as claimed in claim 2, wherein said power supply means comprises a dc storage battery having voltage output corresponding to the voltage useable by said electrically operatable means.

4. An apparatus as claimed in claim 2, wherein said power supply means comprises means for receiving alternating current and means for converting the alternating current to direct current at a voltage corresponding to the voltage useable by said electrically operatable means.

5. An apparatus as claimed in claim 2, wherein indicia is at each of said plurality of switch positions that is illustrative of the function of a particular electrically operatable means to be rendered operative when said switch means is moved to each of said switch positions.

6. An apparatus as claimed in claim 1, wherein the mating connector means is adapted to be attached to a trailer or trailer towing vehicle, and wherein the electrically operatable means comprises lighting system carried by said trailer or said trailer towing vehicle.

7. An apparatus as claimed in claim 6, wherein means are adapted to ground said power supply means to said trailer or trailer towing vehicle.

8. An apparatus as claimed in claim 2, wherein further switch means are supported by said housing means in said second lead means for selectively connecting the power supply means to said rotary switch means, wherein said power supply means comprise a first power source provided by a dc storage battery having a voltage output corresponding to the voltage useable by said electrically operatable means and second power source comprising means for receiving alternating current including transformer means for converting the alternating current to direct current at a voltage substantially similar to that of the storage battery, and wherein said further switch means comprises a multiple position switch for connecting said first power source or said second power source to the rotary switch means.

* * * * *